(12) United States Patent
Schnaitter

(10) Patent No.: US 7,227,397 B1
(45) Date of Patent: Jun. 5, 2007

(54) SYSTEM, METHOD AND CIRCUITS FOR GENERATING A SIGNAL

(75) Inventor: William Schnaitter, San Ramon, CA (US)

(73) Assignee: Transmeta Corporation, Santa Clara, CA (US)

( * ) Notice: Subject to any disclaimer, the term of this patent is extended or adjusted under 35 U.S.C. 154(b) by 52 days.

(21) Appl. No.: 11/096,770

(22) Filed: Mar. 31, 2005

(51) Int. Cl.
*H03K 3/00* (2006.01)

(52) U.S. Cl. .................. 327/291; 327/293; 327/298; 327/355; 327/361; 327/175

(58) Field of Classification Search ............... None
See application file for complete search history.

(56) References Cited

U.S. PATENT DOCUMENTS

| | | | | |
|---|---|---|---|---|
| 4,088,960 A * | 5/1978 | Osborne | ............ | 327/347 |
| 4,705,969 A * | 11/1987 | Gross | ............ | 327/102 |
| 5,051,614 A * | 9/1991 | Ohta | ............ | 327/254 |
| 5,250,910 A * | 10/1993 | Yabuki et al. | ............ | 331/56 |
| 5,402,019 A * | 3/1995 | Drummond et al. | ............ | 327/327 |
| 5,559,457 A * | 9/1996 | Uda et al. | ............ | 327/116 |
| 6,177,832 B1 * | 1/2001 | Durec et al. | ............ | 327/563 |
| 6,441,668 B1 * | 8/2002 | Miller | ............ | 327/298 |
| 6,608,514 B1 * | 8/2003 | Akita et al. | ............ | 327/291 |
| 6,711,360 B1 * | 3/2004 | Wu | ............ | 398/182 |
| 6,879,189 B2 * | 4/2005 | Tallant, II | ............ | 327/108 |

* cited by examiner

*Primary Examiner*—Timothy P. Callahan
*Assistant Examiner*—An T. Luu

(57) ABSTRACT

The present invention relates to the field of electronics. More particularly, forms of the present invention relate to systems, methods and circuits for generating a signal. A system, method and circuit for generating a signal are described. Forms of this system, method and circuit provide clock duty cycle improvement with no frequency reduction. Some such forms provide a clock signal approaching or achieving 50 percent with no significant frequency departure, reduction, etc. from a generated clock. One form of the present invention uses two similar clock signals that oscillate at the same frequency, but effectively inverted one from another. In one such form, the inverted signals are generated with a voltage controlled oscillator having differential stages.

33 Claims, 7 Drawing Sheets

300

SYSTEM, METHOD AND CIRCUITS FOR GENERATING A SIGNAL

TECHNICAL FIELD

The present invention relates to the field of electronics. More particularly, embodiments of the present invention relate to systems, methods and circuits for generating a signal.

BACKGROUND

It is important for clock signals to have a duty cycle as close as possible to 50 percent to obtain the maximum operating frequency for the circuits using the clock.

A clock generator may provide a clock with a duty cycle far from 50 percent in practice. Traditional methods require a frequency divide of the original clock to guarantee a resulting clock with very close to the desired 50 percent duty cycle. Unfortunately, to achieve the desired clock signal using this technique, now the original clock must be capable of twice the desired frequency.

SUMMARY

A system, method and circuit for generating a signal are disclosed. Embodiments of this system, method and circuit provide clock duty cycle improvement with no frequency reduction. These embodiments provide a clock signal approaching or achieving 50 percent with no significant frequency departure, reduction, etc. from a generated clock.

One embodiment of the present invention uses two similar clock signals that oscillate at the same frequency, but effectively inverted one from another, e.g., 180 degrees, π (pi) radians, etc, out of phase with each other. In one embodiment, the inverted signals are generated with a voltage controlled oscillator having differential stages.

DETAILED DESCRIPTION

An exemplary system, method and circuits for generating a signal are described. Reference is now made in detail to several embodiments of the invention, examples of which are illustrated in the accompanying drawing figures. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, one of ordinary skill in the art will realize that embodiments of the present invention may be practiced without these specific details. In other instances, well-known devices, circuits, methods, processes, procedures, systems, components, techniques, apparatus, etc. have not been described in detail for clarity and brevity and so as not to unnecessarily obscure, occlude or obfuscate aspects of embodiments of the present invention.

Portions of the detailed description that follows are presented and discussed in terms of a process. Although steps and sequencing thereof are disclosed in a figure herein (e.g., FIG. 5) describing the operations of these processes (e.g., process 50), such steps and sequencing are exemplary. Embodiments of the present invention are well suited to performing various other steps or variations of the steps recited in the flowcharts of the figures herein, and in a sequence other than that depicted and described herein.

A system, method and circuits for generating a clock signal are described herein. Signals generated with embodiments of the present invention have sharp rising and falling edges and a substantially 50 percent duty cycle. Embodiments of the present invention therefore generate signals that are useful for clocking high speed logic operations, such as those that may operate, transition, change state, etc. on both the rising and falling edges of a high frequency clock cycle. Further, embodiments of the present invention are well suited to function with input signals that have duty cycles significantly below the 50 percent ideal and to improve the duty cycle for use with high frequency clocking operations.

Exemplary System for Generating a Signal

Figure 1:
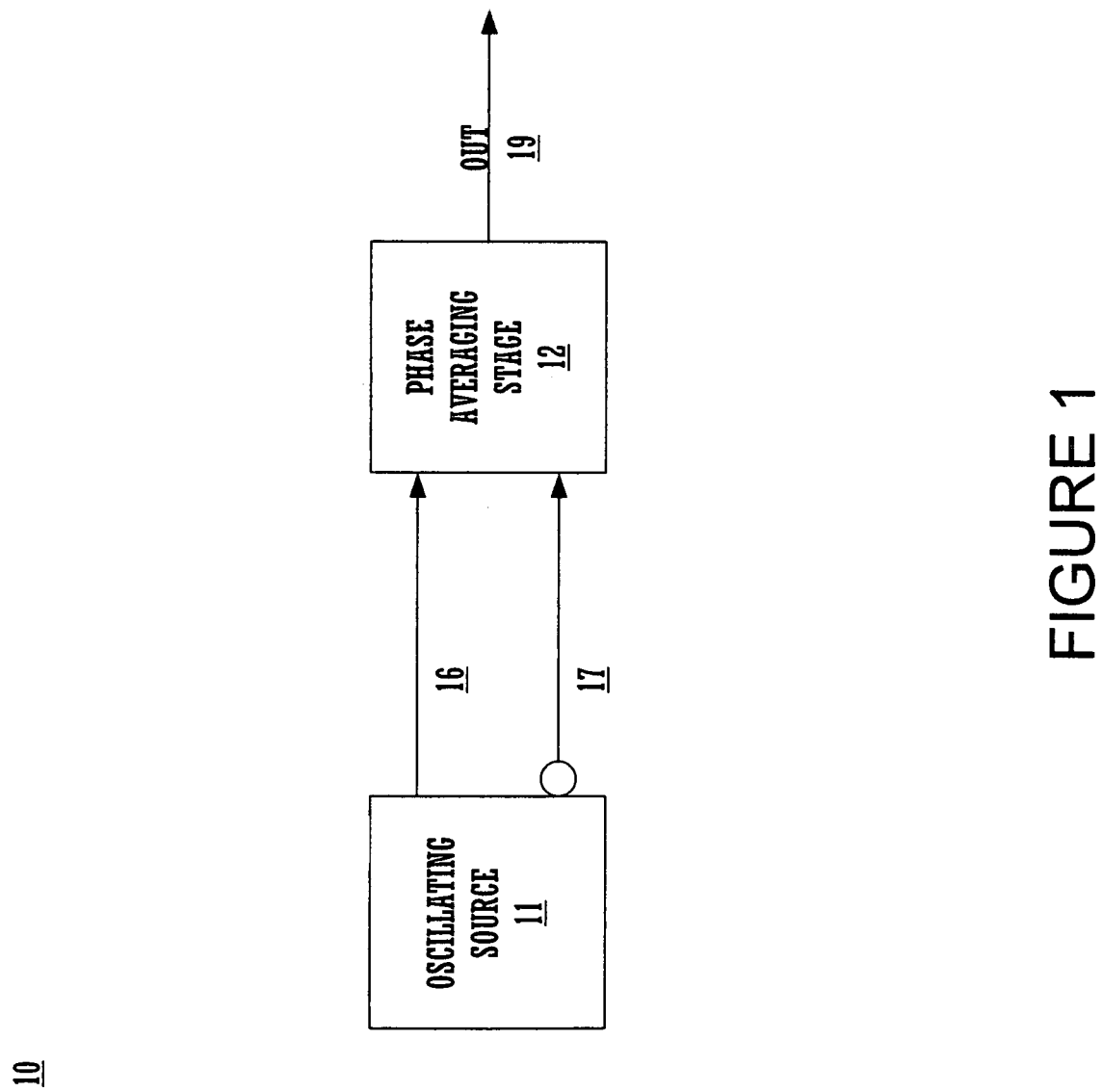
FIG. 1 depicts an exemplary system for generating a signal, according to an embodiment of the present invention.

FIG. 1 depicts an exemplary system 10 for generating a signal, according to an embodiment of the present invention. System 10 has a source 11, which generates a pair of oscillating voltages (e.g., signals, etc.) 16 and 17 at a frequency F and having a duty cycle T'. In one embodiment, voltage 16 oscillates with a waveform complimentary to that with which waveform 17 oscillates, e.g., the oscillators are differential. The voltage 17 waveform is substantially inverted with respect to the waveform of voltage 16.

For instance, when (e.g., at a point in time relevant to both waveforms, effectively simultaneously, etc.) the waveform of voltage 16 reaches a maximum voltage, such as may correspond to a logical one (1) value, the corresponding voltage 17 waveform is at a minimum voltage value, such as may correspond to a logical zero (0) value. Thus, and in a sense familiar to a skilled electronic artisan, the voltage values associated with the waveforms corresponding to voltages 16 and 17 are displaced in time, relative to one another, by a value substantially corresponding to π (pi) radians, 180 degrees, etc. Similarly, it may also be said that differential voltages 16 and 17 each comprise a respective phase wherein they are substantially "out of phase" relative to one another.

Voltages 16 and 17 each comprise an input to a phase averaging stage 12, which is electrically coupled to source 11 in one embodiment. Phase averaging stage 12 generates an output signal 19 according to an effective averaging of the phasing and/or voltage, other electrical characteristics, etc. corresponding to voltages 16 and 17.

Importantly, the output 19 of phase averaging stage 12 has substantially the same frequency F as its inputs 16 and 17 from oscillating source 11. Further, in generating output 19, phase averaging stage 12 improves upon the duty cycle (e.g., the time their associated waveforms are at their maximum voltage value) T' corresponding to inputs 16 and 17. In one embodiment, the duty cycle corresponding to inputs 16 and 17 is greater than or effectively equal to approximately 35 percent. For instance, in one implementation, where duty cycle T' of inputs 16 and 17 is in the range of approximately 35–40 percent, output 19 achieves a duty cycle of approximately 40–45 percent.

This duty cycle improvement achievable with system 10 can be useful in applications such as those relating to high speed logic operations, switching, and the like. Such modern high speed logic and other operations may clock on both rising and falling edges of a clock signal. A duty cycle as close as possible to 50 percent, wherein the propagation delay $T_p$ associated with a logical one (1) value effectively equals the propagation delay $T_p$ associated with a logical zero (0) value and the periods at maximum voltage and minimum voltages are effectively equal, can accordingly be useful thereto. Thus, the ability of system 10 to retain the original (e.g., high) frequency of its source 11 inputs 16 and 17 in generating its output 19, yet with improvement over their duty cycle T' (e.g., closer to 50 percent), exemplifies the usefulness of system 10 with such applications.

In some embodiments, system 10 includes multiple phase averaging stages 12, which are cascadable, paralleable, seriesable, etc. In some such embodiments, system 10 includes two effectively cascaded and/or, partially paralleled and/or seriesed phase averaging stages 12. With the same input duty cycle T', the present two (2) stage phase averaging stage 12 arrangement can achieve further duty cycle improvement for its output 19. In one such implementation, an output 19 duty cycle of effectively 50 percent, such as 48–52 percent is achieved. In one embodiment, system 10 includes three effectively cascaded phase averaging stages 12 to improve the duty cycle. System 10 can effectively cascade any practical number of phase averaging stages 12

In some embodiments, the phase averaging stage 12 has components, series, and arrangements thereof which include, for instance, buffering stages, which can have non-inverting buffers or both non-inverting buffers and inverting buffers, etc., filtering stages. In these embodiments, phase averaging stage 12 can include a filtering stage, which can have an associated impedance, and an output buffer stage. Examples of such embodiments are described herein, such as circuits, processes and the like described below.

Exemplary System for Generating a Signal and Associated Waveforms

Figure 2:
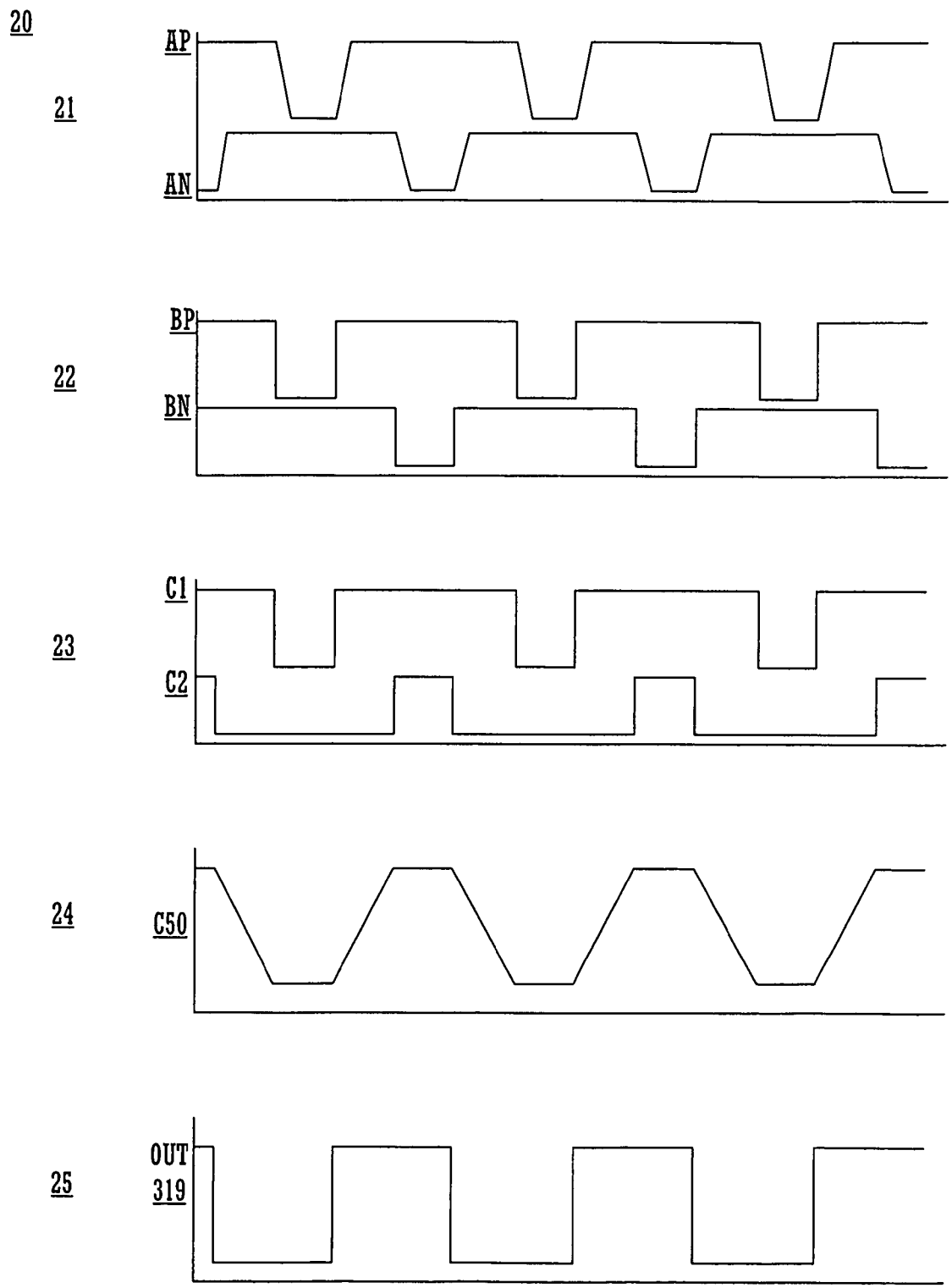
FIG. 2 depicts timing diagrams of exemplary signal waveforms, according to an embodiment of the present invention.
Figure 3:
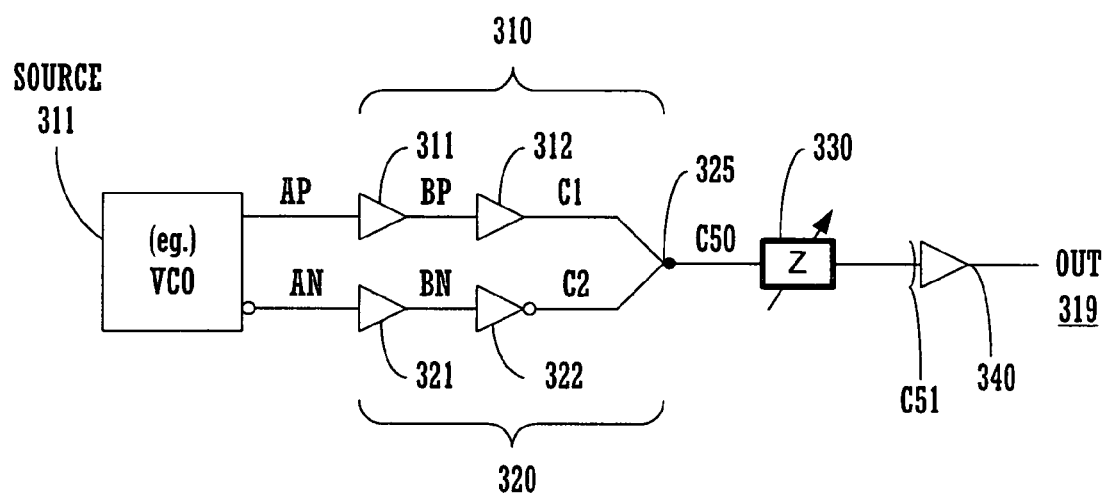
FIG. 3 depicts an exemplary circuit for generating a signal, according to an embodiment of the present invention.

FIG. 2 depicts timing diagrams 20 of exemplary signal waveforms, according to an embodiment of the present invention. FIG. 3 depicts an exemplary circuit 300, according to an embodiment of the present invention. The waveforms depicted with timing diagrams 20 correspond to functions of circuit 300. For clarity and brevity, circuit 300 is thus discussed herein with reference to both FIGS. 2 and 3. In one embodiment, circuit 300 implements a function of system 10, described above with reference to FIG. 1.

Circuit 300 has a source 311 of two differential signal voltages AP and AN, shown in waveform 21. In one embodiment, source 311 comprises a clock generation circuit. In one such embodiment, source 311 comprises a voltage controlled oscillator (VCO), which can have, for instance, differential stages typically used with a phase-locked loop, etc. Inputs AN and AP are substantially similar; both have effectively the same duty cycle, which may be significantly lower than 50 percent. However, input AN is substantially inverted with respect to AP. Signal AN is thus effectively 180 degrees, π radians, etc., out of phase with signal AP.

Signal AP comprises an input for a first series 310 of ratioed buffers 311 and 312. Input signal AP comprises a first oscillating signal with a frequency F3, Series 310 is coupled with buffer 311 to oscillating signal AP. Buffer 311 generates a buffered output BP, as shown in waveform 22. Buffer 312 is coupled to output BP of buffer 311. Buffers 311 and 312 both comprise non-inverting buffers. Buffer 312 generates a first buffered signal C1. As shown in waveform 23, first buffered signal C1 is substantially in phase with respect to oscillating input AP, as well as with buffer 311 output BP.

Signal AN comprises an input for a second series 320 of ratioed buffers 321 and 322. Input signal AN comprises a second oscillating signal with frequency F3. Series 320 is coupled with buffer 321 to oscillating signal AN. Buffer 321 generates a buffered output BN, as shown in waveform 22. Buffer 322 is coupled to output BP of buffer 321. Where buffer 321 is non-inverting, buffer 322 comprises an inverting buffer. Buffer 322 generates a second buffered signal C2. As shown in waveform 23, first buffered signal C2 is substantially inverted with respect to oscillating input AN, as well as with buffer 321 output BN. In one embodiment, first and second buffered signals C1 and C2 have no significant departure from input frequency F3.

In one embodiment, characteristics of buffer 321 substantially match corresponding characteristics of buffer 311. Characteristics of buffer 322 substantially match corresponding characteristics of buffer 312, except that buffer 312 is non-inverting and buffer 311 inverting. First buffer series 310 output C1 is substantially in phase with input AP. However, the output C2 of second buffer series 320 is substantially π radians out of phase with input AN.

The outputs of first buffer series 310 and second buffer series 320 are electrically intercoupled with a conductive union 325, such that their respective outputs C1 and C2 are effectively combined with phase averaging to comprise a phase averaged buffered signal C50, which is shown in waveform 24. Advantageously, phase averaged buffered signal C50 also has no significant departure from input frequency F3.

The phase averaged buffered signal C50 is coupled to a filtering element 330, which in one embodiment has an associated impedance characteristic Z. Filtering element 330 filters phase averaged buffered signal C50 to yield a filtered phase averaged buffered signal C51. In some embodiments, filtering element 330 comprises various impedances. For instance, in one embodiment, filtering element 330 comprises a resistance. In another embodiment, filtering element 330 comprises a resistive-capacitive filter, which can comprise in one exemplary implementation, a resistance and the capacitance associated with one or more of the respective outputs of buffer series 310 and 320. In yet other embodiments, filter element 330 comprises an inductance, an inductive-resistive element, an inductive-capacitive-resistive element, etc.

Figure 4:
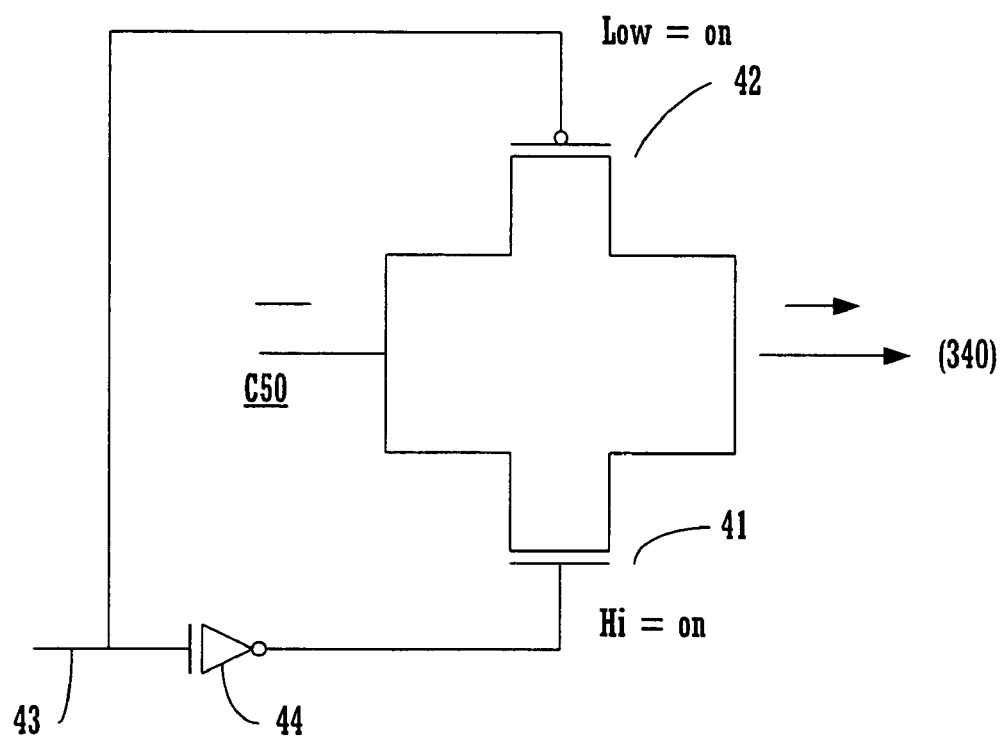
FIG. 4 depicts an exemplary transmission gate, according to an embodiment of the present invention.

In one embodiment, filtering element 330 comprises a variable (e.g., adjustable, tunable, etc.) inductance. In one such embodiment, filtering element 330 comprises a transmission gate, which is tunable, by voltage related adjustments of a control signal. FIG. 4 depicts an exemplary such transmission gate 40, according to an embodiment of the present invention. For clarity and brevity, FIG. 4 is described herein along with relevant description of FIG. 3 Transmission gate 40 includes two parallel transistors 41 and 42. In one implementation, transistor 41 comprises a P-channel field effect transistor (FET) and transistor 42 comprises an N-channel FET, which conduct when switched with a control signal 43.

FET 41 is coupled to control signal 43 with an inverter 44. FET 42 conducts when control signal 43 is low (e.g., zero) and FET 41 conducts when control signal 43 is high (one). In one embodiment, control signal 43 varies according to the duty cycle corresponding to the input signals AP and AN. In certain high speed logic operations and in some other applications, it can be useful for an impedance value associated with filter stage 330 to be relatively high when the input duty cycle is low (e.g., effectively "poor" for the application). Thus, a function associated with filtering stage 330 can be adjusted to improve the duty cycle.

In one embodiment, circuit 300 includes a buffer 340, which effectively functions as an output buffer thereof. Buffer 340 is coupled to the filtered phase averaged buffered signal C51 and sharpens the rising and falling edges thereof to generate an output 319 corresponding thereto with reduced propagation delay. Output 319, shown in waveform 25, has a duty cycle substantially approaching 50 percent, yet with no significant departure from the input frequency F3.

The duty cycle can be further corrected to a value even closer to 50 percent, and without significant departure from the input frequency, with an effective cascading of a similar circuit. For instance, in one embodiment, a second circuit, substantially similar to circuit 300 is effectively cascaded therewith to form a two-stage circuit.

Figure 6:
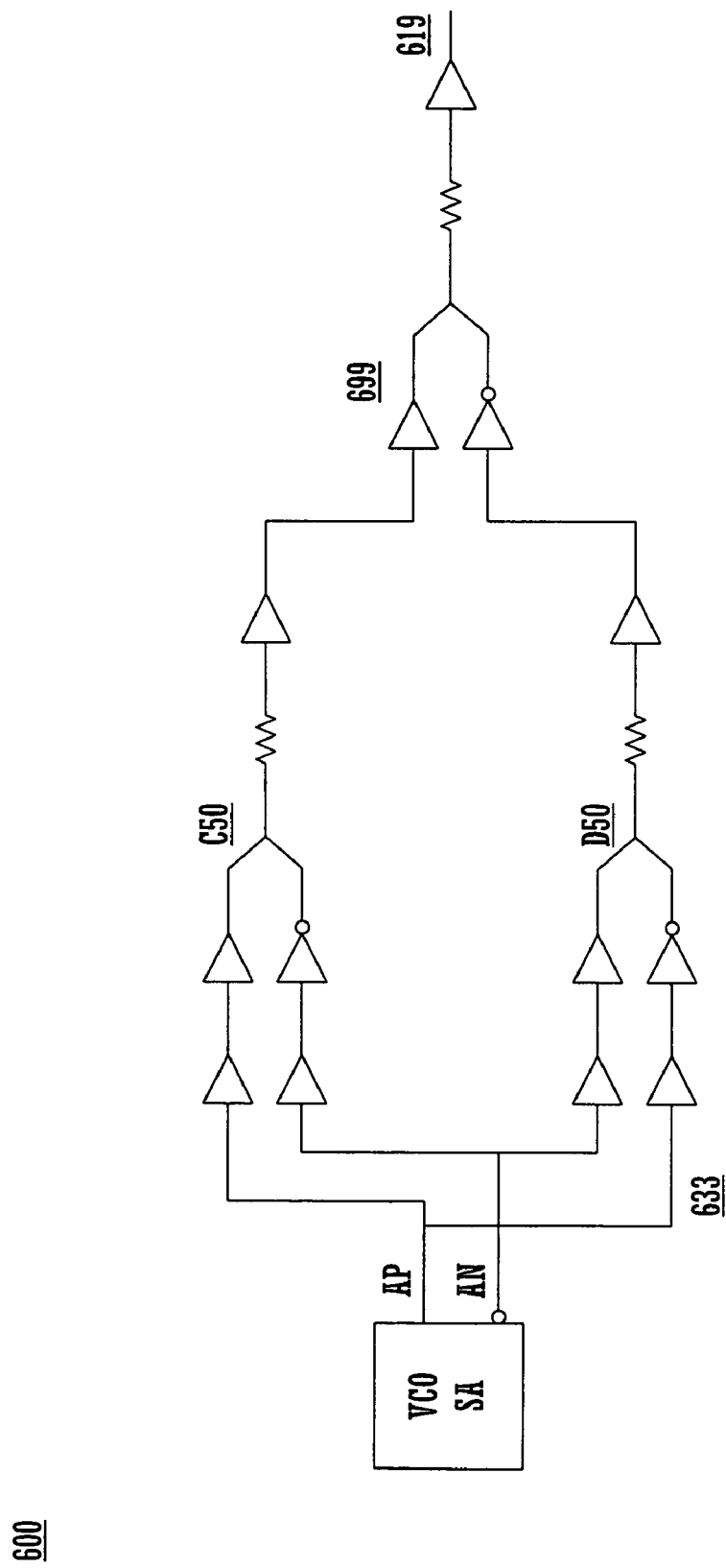
FIG. 6 depicts an exemplary two stage clocking circuit, according to an embodiment of the present invention.

FIG. 6 depicts an exemplary two stage circuit 600, according to an embodiment of the present invention. In such a two-stage circuit, the inputs AP and AN are effectively switched for the second circuit 633, such that input AP is now inverted, and AN not inverted. In this circuit, a phase averaged buffered signal D50 effectively analogizes phase averaged buffered signal C50, but is effectively inverted with respect thereto. Phase averaged buffered signals C50 and D50 then become inputs for a third substantially similar circuit 699. The buffered output 619 thereof has a useful, high duty cycle of from 48–52 percent, which for many applications is effectively close to the ideal 50 percent, yet with a frequency having no significant departure from the input frequency.

Figure 7:
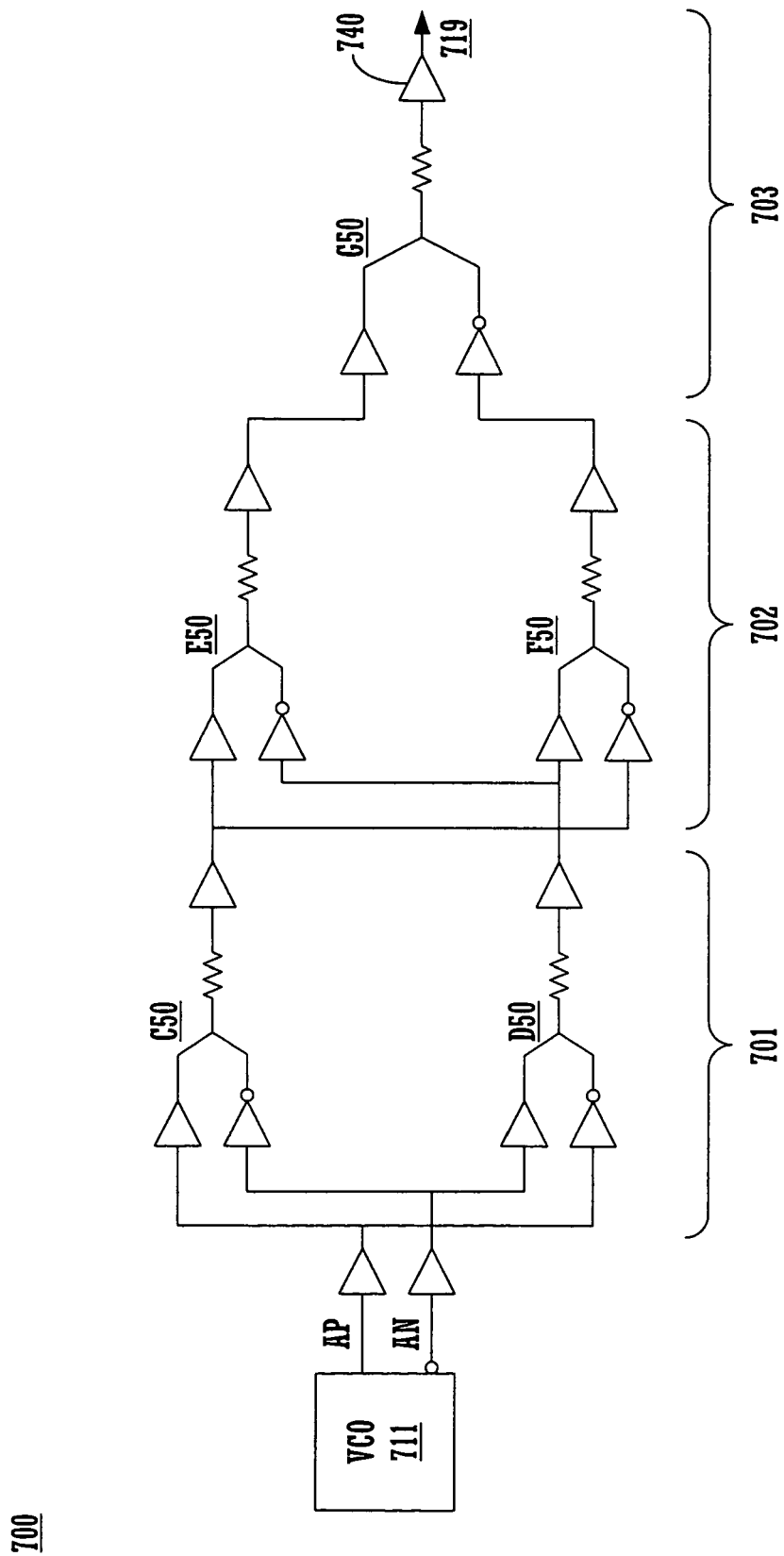
FIG. 7 depicts an exemplary three stage clocking circuit, according to an embodiment of the present invention.

Further such cascading can achieve commensurately greater duty cycle improvement. For instance, FIG. 7 depicts an exemplary three stage circuit 700, according to an embodiment of the present invention. Circuit 700 has three effective stages 701–703. The phase averaged buffered signals C50 and D50 from stage 701 effectively function as inputs for stage 702. The phase averaged buffered signals E50 and F50 from stage 702 effectively function as inputs for stage 703. The phase averaged buffered signal G50 thereof is buffered with an output buffer 740 to generate an approximately ideal output signal 719 for some high speed logic and other operations.

Exemplary Process for Generating a Signal

Figure 5:
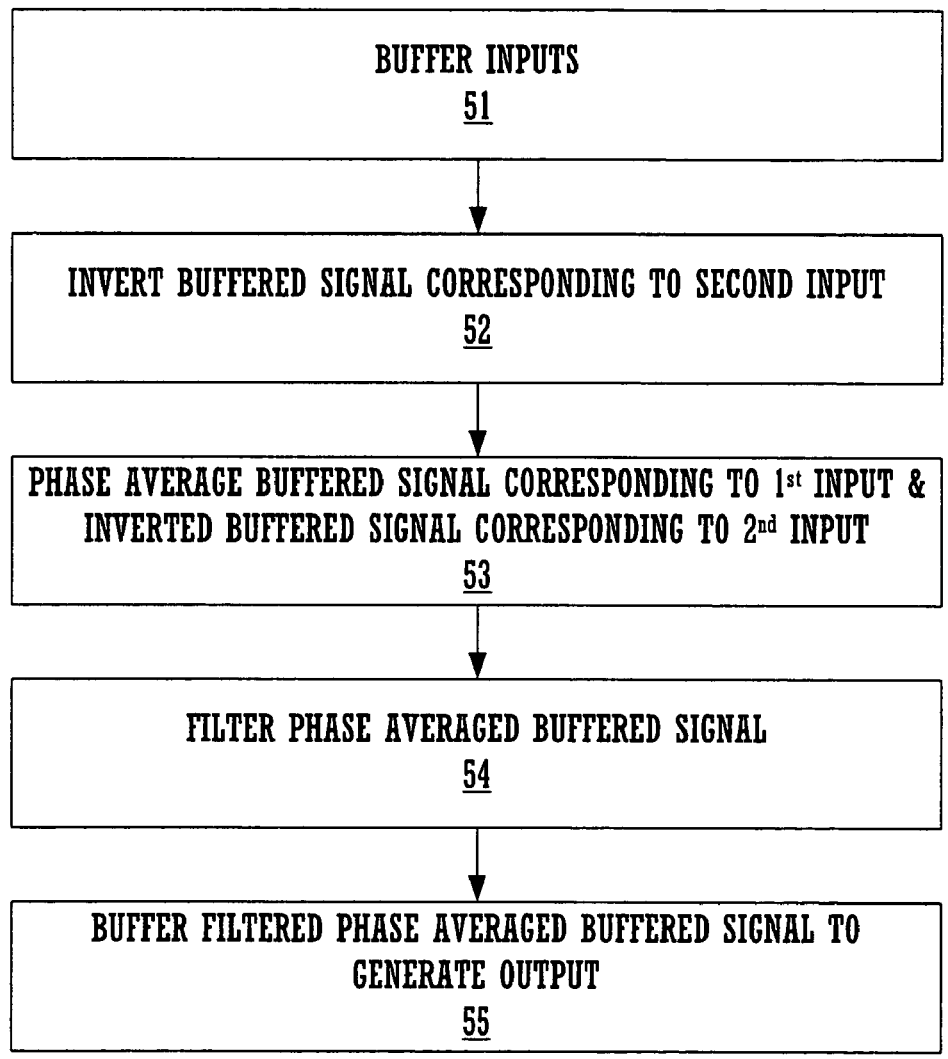
FIG. 5 is a flowchart of an exemplary method for generating a signal, according to an embodiment of the present invention.

FIG. 5 is a flowchart of an exemplary process 50 for generating a signal, according to an embodiment of the present invention. In one embodiment, process 50 describes the function of a system and/or a circuit discussed herein, such as with reference to FIGS. 1 and 3, respectively. Process 50 begins with a step 51, wherein upon their input, a first voltage and a second voltage substantially inverted with respect thereto and both of frequency F4 are buffered to generate a pair of buffered signals respectively corresponding thereto. These input voltages both have a duty cycle of significantly less than 50 percent.

In step 52, the buffered signal corresponding to the second voltage is effectively inverted. In step 53, this pair of buffered signals is effectively phase averaged according to their respective phasing characteristics into a phase averaged buffered signal. The phase averaged buffered signal is also of frequency F4, but has an improved duty cycle, e.g., substantially approaching 50 percent.

In step 54, the phase averaged buffered signal is filtered. In one embodiment, the filtering, which can comprise passing the phase averaged buffered signal through an impedance, is adjusted on the basis of the duty cycle characteristic of the input voltages. In step 55, the filtered phase averaged buffered signal is subjected to buffering, which effectively sharpens the rising and a falling edges of the filtered phase averaged signal to generate an output, completing process 50. The output has effectively the same frequency as the input. However, the duty cycle of the output is significantly improved in comparison thereto.

Thus a system, method and circuits for generating a signal is described. While the present invention has been described in particular embodiments, it should be appreciated that the present invention should not be construed as limited by such embodiments, but rather construed according to the following claims and their equivalents.

What is claimed is:

1. A system for generating a signal, comprising:
a source generating a pair of oscillating voltages at a frequency F with a duty cycle T, a first voltage having a first phase and a second voltage having a second phase that is substantially inverted with respect to said first phase; and a phase averaging stage coupled to said first and said second voltages, for generating said signal according to an average of said first and said second phases at said frequency F and having a duty cycle closer to 50 percent than said T.

2. The system as recited in claim 1 wherein said phase averaging stage comprises a series of buffering stages, a first stage coupled to said first and said second voltages, each buffering stage comprising a matched pair of buffers wherein said first phase and said second phase are each buffered with a respective buffer of each stage, wherein one buffer of a second stage comprises an inverting buffer which buffers a second phase and wherein outputs of said second stage are coupled as a phase-averaged output.

3. The system as recited in claim 2, further comprising a filter coupled to said phase-averaged output and providing a filtered voltage corresponding thereto.

4. The system as recited in claim 3, further comprising a buffer coupled to said filtered voltage and generating said signal corresponding thereto wherein a rising and a falling edge thereof are sharpened, relative to said filtered voltage.

5. The system as recited in claim 1 wherein said duty cycle of said signal substantially approaches 50 percent.

6. The system as recited in claim 5 wherein said duty cycle of said signal is in the range of 40–45 percent.

7. The system as recited in claim 1 wherein said source voltage duty cycle T is greater than 35 percent.

8. The system as recited in claim 7 wherein source voltage duty cycle T is in the range of 35–40 percent.

9. The system as recited in claim 1 wherein said source comprises a voltage controlled oscillator.

10. The system as recited in claim 3 wherein said filter comprises an impedance.

11. The system as recited in claim 10 wherein said impedance comprises one or more of a resistance, a capacitance and an inductance.

12. The system as recited in claim 10 wherein said impedance is adjustable, based on a value of said input duty cycle T.

13. The system as recited in claim 10 wherein said impedance comprises a transmission gate.

14. The system as recited in claim 1 wherein said duty cycle of said signal comprises a value of T' wherein said T' is greater than said T and further comprising one or more staged systems substantially similar to said system wherein said staged systems function with said system to generate a unified output signal of said frequency F and having a duty cycle greater than said T'.

15. A method for generating a signal with a duty cycle substantially approaching 50 percent, comprising:
upon input of a first voltage of a frequency F' with a first phase characteristic and a second voltage with said frequency F' and a phase characteristic substantially inverted with respect to said first voltage, said input having a duty cycle of T', buffering said first and said second voltages to generate a pair of buffered signals respectively corresponding to said voltages; inverting said buffered signal corresponding to said second voltage; averaging said pair of buffered signals according to their respective phasing characteristics into a phase averaged buffered signal, wherein said phase averaged buffered signal comprises said frequency F' and a duty cycle closer to 50 percent than said T'.

16. The method as recited in claim 15, further comprising filtering said phase averaged buffered signal.

17. The method as recited in claim 16 further comprising responsively adjusting said filtering on the basis of a duty cycle characteristic of said input.

18. The method as recited in claim 16 further comprising, upon said filtering, further buffering said filtered phase averaged signal, wherein said further buffering sharpens a rising and a falling edge of said filtered, phase averaged signal and generates an output corresponding thereto.

19. The method as recited in claim 15 wherein said input duty cycle is in the range of approximately 35–40 percent.

20. A circuit based system for clocking, comprising:
an oscillating stage with at least two outputs having complimentary waveforms and of a frequency F2, one said output substantially inverted with respect to the other;
a buffer stage comprising at least one pair of buffers, a first buffer pair coupled to said outputs, wherein a buffer of said first buffer pair coupled to said inverted output comprises an inverting buffer, wherein outputs of said first buffer stage are coupled as a phase averaged buffer output;
a filtering stage coupled to said phase averaged output and generating a filtered output corresponding thereto; and
an output stage coupled to said filtered output for generating a clocking output signal corresponding thereto having substantially matched rising and falling edges, said frequency F2 and a duty cycle comprising a value substantially approaching 50 percent.

21. The system as recited in claim 20 wherein said oscillating stage comprises a voltage controlled oscillator.

22. The system as recited in claim 20 wherein said buffer stage comprises a second buffer pair comprising two (2) non-inverting buffers.

23. The system as recited in claim 20 wherein said filter stage comprises an impedance wherein said impedance comprises one or more of a resistance, an inductance, a capacitance, and a transmission gate.

24. The system as recited in claim 23 wherein a value corresponding to said impedance is adjustable, based on a duty cycle characterizing said oscillating stage outputs.

25. The system as recited in claim 20 wherein said oscillating stage output comprises a duty cycle significantly less than 50 percent.

26. The system as recited in claim 20 wherein said oscillating stage output comprises a duty cycle in the range of approximately 35–40 percent.

27. A circuit for generating a clock signal having a duty cycle substantially approaching 50 percent, comprising:
a first series of ratioed buffers for buffering a first oscillating signal having a frequency F3, said first series comprising:
a first buffer coupled to said first oscillating signal; and
a second buffer in series with said first buffer, and wherein said first and second buffers comprise non-inverting buffers and generate a first buffered signal substantially in phase with respect to said first oscillating signal;
a second series of ratioed buffers for buffering a second oscillating signal having said frequency F3, wherein said second oscillating signal is complimentary and inverted with respect to said first oscillating signal, said second series comprising a third buffer and a fourth buffer coupled in series, wherein characteristics of said third buffer substantially match corresponding characteristics of said first buffer and characteristics of said fourth buffer substantially match corresponding characteristics of said second buffer, said third buffer coupled to said second oscillating signal, wherein said third buffer comprises a non-inverting buffer and said fourth buffer comprises an inverting buffer, and wherein said second series generates a second buffered signal substantially inverted with respect to said second oscillating signal, and
a conductive union at which said first and said second buffered signals are electrically intercoupled to produce a phase averaged buffered signal having said frequency F3.

28. The circuit as recited in claim 27, further comprising a filtering element coupled to said conductive union and generating a filtered phase averaged buffered signal corresponding thereto.

29. The circuit as recited in claim 28 wherein said filtering element comprises an impedance, and wherein said impedance comprises one or more of a resistance, an inductance, a capacitance, and a transmission gate.

30. The circuit as recited in claim 29 wherein a value corresponding to said impedance is adjustable, based on a duty cycle characterizing said first and said second oscillating signals.

31. The circuit as recited in claim 28 further comprising a fifth buffer coupled to said filtered phase averaged buffered signal, for sharpening the rising and falling edges thereof, and generating an output corresponding thereto, said output having a duty cycle substantially approaching 50 percent.

32. The circuit as recited in claim 27 wherein said first and said second oscillating signals are generated with a voltage controlled oscillator coupled to said circuit.

33. The circuit as recited in claim 27 wherein said first and said second oscillating signals each have a duty cycle in the range of approximately 35–40 percent.

* * * * *